United States Patent
You

(10) Patent No.: US 9,634,076 B2
(45) Date of Patent: Apr. 25, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Chungi You, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/712,604

(22) Filed: May 14, 2015

(65) Prior Publication Data

US 2016/0104754 A1 Apr. 14, 2016

(30) Foreign Application Priority Data

Oct. 14, 2014 (KR) .......................... 10-2014-0138613

(51) Int. Cl.
*H01L 27/32* (2006.01)

(52) U.S. Cl.
CPC ................ *H01L 27/3262* (2013.01)

(58) Field of Classification Search
CPC . H01L 21/283; H01L 27/326; H01L 27/3248; H01L 27/3258; H01L 27/3262; H01L 29/04; H01L 29/786; H01L 51/5228
See application file for complete search history.

(56) References Cited

U.S. PATENT DOCUMENTS

| 2003/0062518 | A1 | 4/2003 | Auch et al. |
| 2011/0303922 | A1* | 12/2011 | Cho ............... H01L 27/1248 257/71 |
| 2013/0175533 | A1 | 7/2013 | Lee et al. |
| 2013/0200379 | A1* | 8/2013 | You ............... H01L 29/4908 257/59 |
| 2014/0061607 | A1 | 3/2014 | You et al. |

FOREIGN PATENT DOCUMENTS

| KR | 10-2013-0080642 A | 7/2013 |
| KR | 10-2014-0032267 A | 3/2014 |

* cited by examiner

*Primary Examiner* — Kyoung Lee
(74) *Attorney, Agent, or Firm* — Lewis Roca Rothgerber Christie LLP

(57) ABSTRACT

An organic light-emitting display apparatus includes a substrate; a thin film transistor (TFT) on the substrate; a first interlayer insulating layer between a gate electrode and the source electrode and between a drain electrode and the source electrode of the TFT and including an inorganic material; a second interlayer insulating layer between the first interlayer insulating layer and the source electrode and between the first interlayer insulating layer and the drain electrode and including an organic material; a first organic layer on the source electrode and the drain electrode; a capacitor, a second electrode, and the first interlayer insulating layer between the first electrode and the second electrode; a pixel electrode in an aperture in the second interlayer insulating layer adjacent to the thin film transistor and the capacitor and coupled to the source electrode or the drain electrode; an organic emission layer; and an opposite electrode.

22 Claims, 8 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2014-0138613, filed on Oct. 14, 2014 in the Korean Intellectual Property Office, the disclosure of which is incorporated herein in its entirety by reference.

BACKGROUND

1. Field

One or more exemplary embodiments of the present invention relate to an organic light-emitting display apparatus and a method of manufacturing the organic light-emitting display apparatus.

2. Description of the Related Art

An organic light-emitting display apparatus is a self-emissive display apparatus including a hole injection electrode, an electron injection electrode, and an organic emission layer formed between the hole injection electrode and the electron injection electrode in which holes injected from the hole injection electrode and electrons injected from the electron injection electrode are recombined, thereby emitting light. Organic light-emitting display apparatuses have various high quality characteristics, such as low power consumption, high brightness, and a fast response time and, thus, have drawn attention as a next-generation display apparatus.

SUMMARY

One or more exemplary embodiments of the present invention include an organic light-emitting display apparatus having improved display quality and yield and a method of manufacturing the organic light-emitting display apparatus.

Additional aspects will be set forth in part in the description which follows and, in part, will be apparent from the description or may be learned by practice of the presented embodiments.

According to one or more exemplary embodiments of the present invention, an organic light-emitting display apparatus includes a substrate; a thin film transistor on the substrate and including an active layer, a gate electrode, a source electrode and a drain electrode; a first interlayer insulating layer between the gate electrode and the source electrode and between the gate electrode and the drain electrode, the first interlayer insulating layer including an inorganic material; a second interlayer insulating layer between the first interlayer insulating layer and the source electrode and between the first interlayer insulating layer and the drain electrode, the second interlayer insulating layer including an organic material; a first organic layer on the source electrode and the drain electrode; a capacitor including a first electrode including the same material as that of the gate electrode, a second electrode including the same material as that of the source electrode and the drain electrode, and the first interlayer insulating layer between the first electrode and the second electrode; a pixel electrode in an aperture in the second interlayer insulating layer at an area adjacent to the thin film transistor and the capacitor, the pixel electrode being coupled to one of the source electrode and the drain electrode; an organic emission layer on the pixel electrode; and an opposite electrode on the organic emission layer.

In some embodiments, the pixel electrode may be a semi-transmissive electrode, and the opposite electrode is a reflective electrode.

In some embodiments, the pixel electrode may include a first transparent conductive oxide layer, a semi-transmissive metal layer, and a second transparent conductive oxide layer.

In some embodiments, an end portion of the pixel electrode may be on the first interlayer insulating layer and may be covered by the second interlayer insulating layer.

In some embodiments, the aperture in which the pixel electrode is disposed may expose the second interlayer insulating layer and the first organic layer.

In some embodiments a diameter of the aperture in the second interlayer insulating layer may be greater than a diameter of an aperture in the first organic layer.

In some embodiments, a diameter of the aperture for in the second interlayer insulating layer may be smaller than a diameter of an aperture in the first organic layer.

In some embodiments, an end portion of a first dielectric film may be outside the aperture in the second interlayer insulating layer.

In some embodiments, a lower surface of the pixel electrode may contact an upper surface of the first interlayer insulating layer.

In some embodiments, a thickness of the gate electrode may be in a range of about 6,000 Å to about 12,000 Å.

In some embodiments, the second electrode of the capacitor may be in another aperture in the second interlayer insulating layer.

In some embodiments, a lower surface of the second electrode of the capacitor may contact an upper surface of the first interlayer insulating layer.

In some embodiments, a protection layer may be on the source electrode and on the drain electrode.

In some embodiments, the organic light-emitting display apparatus may further include a pad electrode on the same layer as the source electrode and the drain electrode.

In some embodiments, a protection layer may be on the pad electrode.

In some embodiments, the organic light-emitting display apparatus may further include a cathode contact layer on the second interlayer insulating layer and contacting the opposite electrode via a contact opening in the first organic layer.

In some embodiments, the cathode contact layer may include the same material as that of the source electrode and the drain electrode.

In some embodiments, a protection layer may be on the cathode contact layer.

In some embodiments, the pixel electrode may include a first transparent conductive oxide layer, a semi-transmissive metal layer, and a second transparent conductive oxide layer.

According to one or more exemplary embodiments of the present invention, a method of manufacturing an organic light-emitting display apparatus includes a first process including forming a semiconductor layer on a substrate, patterning the semiconductor layer, and then forming an active layer of a thin film transistor; a second process including forming a first insulating layer, forming a first metal layer on the first insulating layer, and patterning the first metal layer to form a gate electrode of the thin film transistor and a first electrode of a capacitor; a third process including forming a first interlayer insulating layer, forming a semi-transmissive metal layer on the first interlayer insulating layer, and patterning the semi-transmissive metal layer to form a pixel electrode; a fourth process including forming the first interlayer insulating layer and forming an aperture in the first interlayer insulating layer to expose a portion of the active layer; a fifth process including forming a second interlayer insulating layer and patterning the second interlayer insulating layer to form apertures respectively exposing the portion of the active layer, an upper portion of the pixel electrode, and the first interlayer insulating layer corresponding to the first electrode of the capacitor; a sixth process including forming a second metal layer and a protection layer, and patterning the second metal layer and the protection layer to form a source electrode, a drain electrode, a second electrode of the capacitor, and a pad electrode; and a seventh process including forming a first organic layer and patterning the first organic layer to form apertures respectively exposing an upper portion of the pixel electrode and an upper portion of the pad electrode.

In some embodiments, the first interlayer insulating layer may include an inorganic film, and the second interlayer insulating layer may include an organic film.

In some embodiments, in the fifth process, the second interlayer insulating layer may be patterned such that a portion of the second interlayer insulating layer remains on an upper surface of the pixel electrode, and in the seventh process, the first organic layer and the remaining portion of the second interlayer insulating layer may be patterned to expose the upper surface of the pixel electrode.

In some embodiments, in the seventh process, an end portion of the first organic layer may be outside the aperture in the second interlayer insulating layer that exposes the upper portion of the pixel electrode.

BRIEF DESCRIPTION OF THE DRAWINGS

These and/or other aspects and characteristics will become apparent and more readily appreciated from the following description of exemplary embodiments, taken in conjunction with the accompanying drawings in which.

DETAILED DESCRIPTION

Figure 1:
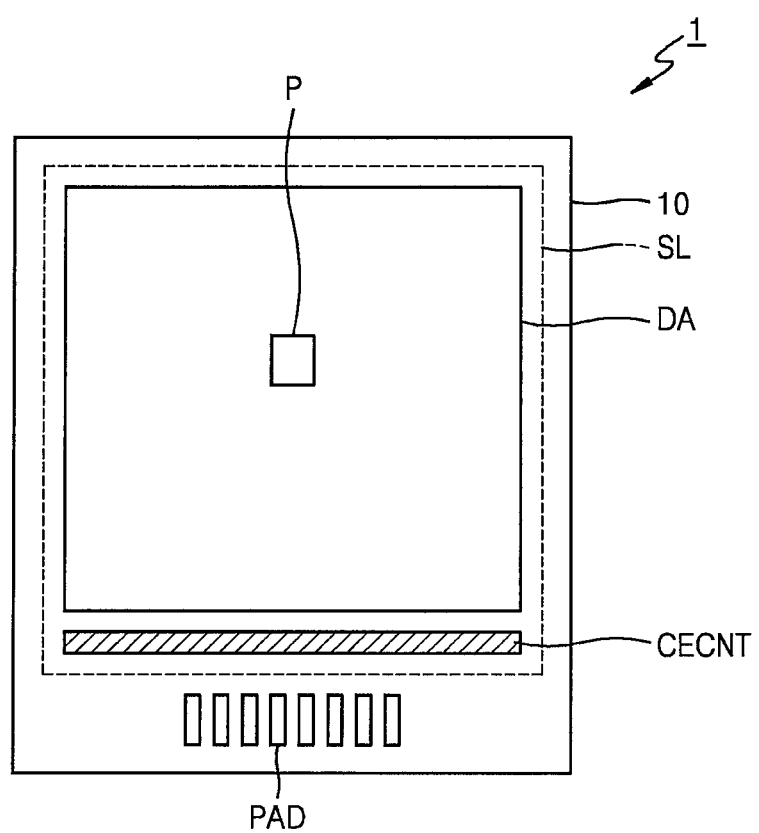
FIG. 1 is a schematic plan view showing an organic light-emitting display apparatus according to an embodiment of the present invention.

Reference will now be made in detail to exemplary embodiments of the present invention, examples of which are illustrated in the accompanying drawings, wherein like reference numerals refer to like elements throughout. The presented exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Further, the use of "may" when describing embodiments of the present invention relates to "one or more embodiments of the present invention". Expression, such as "at least one of," when preceding a list of elements, modify the entire list of elements and do not modify the individual elements of the list. Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another elements) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the singular forms "a" and "an" are intended to include the plural forms as well, unless the context clearly indicates otherwise.

It will be further understood that the terms "includes," "including," "comprises," and/or "comprising" used herein specify the presence of stated features or components, but do not preclude the presence or addition of one or more other features or components. Further, when a first element is described as being "coupled" or "connected" to a second element, the first element may be directly coupled or connected to the second element or the first element may be indirectly coupled or connected to the second element via one or more intervening elements.

It will be understood that when a layer, region, or component is referred to as being "on" or "formed on," another layer, region, or component, it can be directly or indirectly on or formed on the other layer, region, or component. That is, for example, intervening layers, regions, or components may also be present.

Sizes of elements or layers in the drawings may be exaggerated for convenience of explanation. Because sizes and thicknesses of elements or layers in the drawings may be arbitrarily illustrated for convenience of explanation, the following embodiments are not limited thereto.

Figure 2:
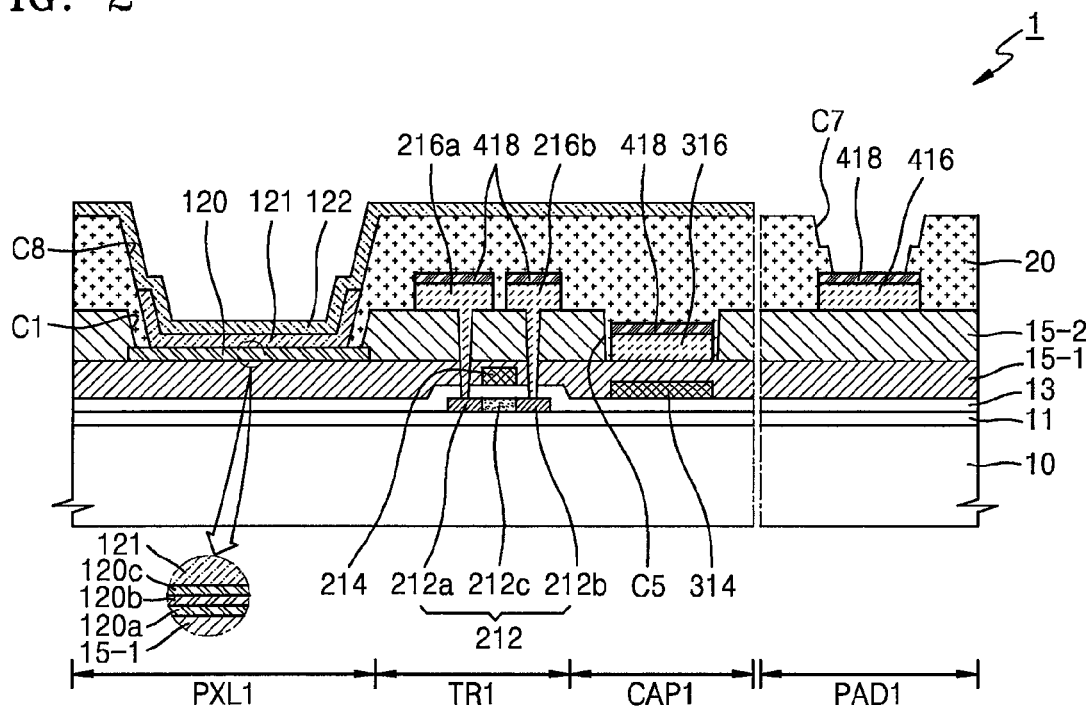
FIG. 2 is a schematic cross-sectional view showing some portions of an emission pixel and a pad of the organic light-emitting display apparatus according to an embodiment of the present invention.

FIG. 1 is a schematic plan view showing an organic light-emitting display apparatus 1 according to an embodiment of the present invention. FIG. 2 is a schematic cross-sectional view showing some portions of an emission pixel and a pad PAD of the organic light-emitting display apparatus 1 according to an embodiment of the present invention.

Referring to FIG. 1, according to an embodiment of the present invention, a display area DA that includes a plurality of pixels P and displays an image is provided on a substrate 10 of the organic light-emitting display apparatus 1. The display area DA is formed inside a sealing line SL and includes an encapsulation member for encapsulating the display area DA along the sealing line SL. A cathode contact portion CECNT (e.g., a cathode contact unit) for supplying power to a cathode that is commonly formed in the display area DA is formed between the display area DA and the pad PAD.

Referring to FIG. 2, a pixel area PXL1 including at least one organic emission layer 121, a transistor area TR1 including at least one thin film transistor (TFT), a capacitor area CAP1 including at least one capacitor, and a pad area PAD1 are provided on the substrate 10.

An active layer 212 of a thin film transistor is provided on the substrate 10 and on a buffer layer 11 in the transistor area TR1.

The substrate 10 may be a transparent substrate, such as a glass substrate or a plastic substrate including polyethylen terephthalate (PET), polyethylen naphthalate (PEN), or polyimide, etc.

The buffer layer 11 that forms a planar surface on an upper portion of the substrate 10 and prevents impurities from infiltrating therethrough may be further provided on the substrate 10. The buffer layer 11 may be formed in a single-layer or as a multi-layer structure including silicon nitride and/or silicon oxide.

The active layer 212 is provided on the buffer layer 11 in the thin film transistor area TR1. The active layer 212 may be formed of a semiconductor including amorphous silicon or polysilicon. The active layer 212 may include a channel region 212c and a source region 212a and a drain region 212b that are doped with an ion impurity and disposed outside the channel region 212c. The active layer 212 is not limited to amorphous silicon or polysilicon and may include an oxide semiconductor, for example.

A gate insulating layer 13 is formed on the active layer 212. The gate insulating layer 13 may be formed in a single-layer or as a multi-layer structure including silicon nitride and/or silicon oxide.

A gate electrode 214 is formed on the gate insulating layer 13. The gate electrode 214 may be formed in a single-layer or as a multi-layer structure including at least one metal, for example, aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

A wiring, such as one or more scan lines, may be formed on the same layer as that of the gate electrode 214 and may include the same material as that of the gate electrode 214. As a screen (e.g., the display area) of the organic light-emitting display apparatus 1 becomes larger, a thickness of the wiring may also be increased in an effort to prevent or reduce a signal delay caused by the large screen, and the signal delay caused by the large screen may be thereby prevented or reduced. In one embodiment, a thickness of the gate electrode 214 and the wiring may be in a range of about 6,000 Å to about 12,000 Å. When the thickness of the gate electrode 214 and the wiring is at least equal to or greater than about 6,000 Å, a signal delay prevention effect in a large screen of 50 or more inches may occur (e.g., a large screen of 50 or more inches may experience a reduced signal delay effect). It may be difficult to increase the thickness of the gate electrode 214 and the wiring to be greater than about 12,000 Å in a deposition process.

A first interlayer insulating layer 15-1 and a second interlayer insulating layer 15-2 are positioned on the gate electrode 214. The first interlayer insulating layer 15-1 may be formed as an inorganic insulating film, and the second interlayer insulating layer 15-2 may be formed as an organic insulating film. The thickness of the gate electrode 214 and the wiring may be relatively large to prevent or reduce a signal delay in the organic light-emitting display apparatus 1 having a large screen. However, if only an inorganic insulating film, such as the first interlayer insulating layer 15-1, is formed, a crack may occur in the inorganic insulating film due to the thickness of the wiring. In addition, if only the first interlayer insulating layer 15-1 is formed, a parasitic capacitance increases between a wiring formed below the first interlayer insulating layer 15-1 and a wiring formed on (e.g., above) the first interlayer insulating layer 15-1, which causes capacitive coupling, and thus, an exact (e.g., a precise and/or consistent) signal transmission may be prevented. However, according to the organic light-emitting display apparatus 1 of the present embodiment, even when the thickness of the gate electrode 214 is increased, because the second interlayer insulating layer 15-2, that is, the organic layer, is formed, a crack in the first interlayer insulating layer 15-1 may be reduced or prevented and a parasitic capacitance between wirings formed below and on the first and second interlayer insulating layers 15-1 and 15-2 may be reduced. Thus, an exact (e.g., a precise and/or consistent) signal transmission may be maintained.

A source electrode 216a and a drain electrode 216b are formed on the second interlayer insulating layer 15-2. The source electrode 216a and the drain electrode 216b may be formed as two or more heterogeneous metal layers having different electron mobilities. For example, the source electrode 216a and the drain electrode 216b may be formed as two or more layers including a metal, for example, aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or an alloy thereof.

A protection layer 418 is formed on the source electrode 216a and the drain electrode 216b. The protection layer 418 may prevent a surface (e.g., a top surface) of the source electrode 216a and the drain electrode 216b from being exposed to an etchant while etching the source electrode 216a and the drain electrode 216b, thereby reducing a particle defect.

The protection layer 418 and the source electrode 216a and the protection layer 418 and the drain electrode 216b are etched with a same (e.g., a single) mask, and thus, the number of manufacturing processes or steps may be reduced. Because the protection layer 418 and the source electrode 216a and the protection layer 418 and the drain electrode 216b are formed during a same process (e.g., using a same or a single mask), etching surfaces of end portions of the protection layer 418 and the source electrode 216a may be identical, and etching surfaces of end portions of the protection layer 418 and the drain electrode 216b may be identical.

A first organic layer 20 is positioned on the source electrode 216a and the drain electrode 216b to cover the source electrode 216a and the drain electrode 216b. The first organic layer 20 may include a commercial polymer (e.g., polymethyl methacrylate (PMMA) and/or Polystyrene (PS)), a polymer derivative having a phenol group, an acrylic-based polymer, an imide-based polymer, an aryleether-based polymer, an amide-based polymer, a fluorinated polymer, a p-xylene-based polymer, a vinyl alcohol-based polymer, and/or blends thereof.

One of the source electrode 216a and the drain electrode 216b is electrically coupled to (e.g., electrically connected to) a pixel electrode 120.

The pixel electrode 120 is provided on the buffer layer 11, on the gate insulating layer 13, and on the first interlayer insulating layer 15-1 in the pixel area PXL1. The pixel electrode 120 is disposed in an aperture formed in an area that does not overlap with the aforementioned thin film transistor (e.g., the transistor area TR1) and the capacitor (e.g., the capacitor area CAPs) that will be further explained later.

A width of an aperture C8 formed in the first organic layer 20 is smaller than a width of an aperture C1 formed in the second interlayer insulating layer 15-2. The aperture C8 formed in the first organic layer 20 and the aperture C1 formed in the second interlayer insulating layer 15-2 overlap with each other.

The pixel electrode 120 is formed to directly contact an upper surface of the first interlayer insulating layer 15-1, and an end portion of the pixel electrode 120 is covered by the second interlayer insulating layer 15-2.

The pixel electrode 120 includes a semi-transmissive metal layer 120b. The pixel electrode 120 may further include layers 120a and 120c that are respectively formed on a lower portion and an upper portion of the semi-transmissive metal layer 120b and include a transparent conductive oxide that protects the semi-transmissive metal layer 120b.

The semi-transmissive metal layer 120b may be formed of silver (Ag) or a silver alloy. The semi-transmissive metal layer 120b may form a micro-cavity structure with (e.g., along) an opposite electrode 122 that is a reflective electrode that will be further described later, thereby improving light efficiency of the organic light-emitting display apparatus 1.

The layers 120a and 120c including the transparent conductive oxide may include at least one material, for example, one or more of indium tin oxide (ITO), indium zinc oxide (IZO), zinc oxide (ZnO), indium oxide ($In_2O_3$), indium gallium oxide (IGO), and aluminum zinc oxide (AZO). The transparent conductive oxide layer 120a formed on the lower portion of the semi-transmissive metal layer 120b may reinforce (e.g., increase) an adhesion force between the first interlayer insulating layer 15-1 and the pixel electrode 120. The transparent conductive oxide layer 120c formed on the upper portion of the semi-transmissive metal layer 120b may serve as a barrier layer protecting the semi-transmissive metal layer 120b.

The semi-transmissive metal layer 120b that is formed of a highly reducible metal, such as silver (Ag), may cause a problem in which silver (Ag) particles are extracted in a process of etching the pixel electrode 120. The extracted silver (Ag) particles may be a particle defect factor that causes dark spots. In the case in which the source electrode 216a, the drain electrode 216b, a pad electrode 416, and/or the wiring are exposed to an etchant in the process of etching the pixel electrode 120 including silver (Ag), highly reducible silver (Ag) ions may gain electrons from these metal materials and may be re-extracted as silver (Ag) particles.

However, in the organic light-emitting display apparatus 1 according to the present embodiment, the source electrode 216a, the drain electrode 216b, and the pad electrode 416 are protected by the protection layer 418, and thus, these layers are not exposed to the etchant, thereby preventing or reducing the particle defect due to the re-extraction of silver (Ag) particles.

An intermediate layer including the organic emission layer 121 is formed on the pixel electrode 120, and an upper surface (e.g., a whole upper surface) of the intermediate layer is exposed via the aperture C8 formed in the first organic layer 20. The organic emission layer 121 may be formed of a low molecular weight organic material or a polymer organic material.

When the organic emission layer 121 is formed of the low molecular weight organic material, the intermediate layer may further include a hole transport layer (HTL), a hole injection layer (HIL), an electron transport layer (ETL), and/or an electron injection layer (EIL). The intermediate layer may further include various layers as desired. Various organic materials, such as copper phthalocyanine (CuPc), N,N'-Di(naphthalene-1-yl)-N,N'-diphenyl-benzidine (NPB), and/or tris-8-hydroxyquinoline aluminum) (Alq3) may be used.

When the organic emission layer 121 is formed of the polymer organic material, the intermediate layer may further include a hole transport layer (HTL). The HTL may include poly-(2,4)-ethylene-dihydroxy thiophene (PEDOT), polyaniline (PANI), or the like. In this embodiment, examples of polymer organic materials include poly-phenylenevinylene (PPV)-based polymer organic material, polyfluorene-based polymer organic material, and the like. An inorganic layer may be further disposed between the organic emission layer 121 and the pixel electrode 120 and between the organic emission layer 121 and the opposite electrode 122.

Although, in FIG. 2, the organic emission layer 121 is positioned in the aperture C8, the present invention is not limited thereto. The organic emission layer 121 may be positioned inside the aperture C8 and may also extend to an upper surface of the first organic layer 20 along an etching surface of the aperture C8 formed in the first organic layer 20.

The opposite electrode 122 commonly formed for a plurality of pixels is formed on the organic emission layer 121. In the organic light-emitting display apparatus 1 according to the present embodiment, the pixel electrode 120 serves as an anode and the opposite electrode 122 serves as a cathode. Polarities of electrodes may also be switched.

The opposite electrode 122 may be a reflective electrode including a reflective material. In this embodiment, the opposite electrode 122 may include at least one material, for example, Al, Mg, Li, Ca, LiF/Ca, and/or LiF/Al. Because the opposite electrode 122 is configured as the reflective electrode, light emitted from the organic emission layer 121 is reflected by the opposite electrode 122 and discharged toward the substrate 10 via the pixel electrode 120 formed of a semi-transmissive metal.

A capacitor including a first electrode 314 and a second electrode 316 is disposed in the capacitor area CAP1.

Only the first interlayer insulating layer 15-1 that is an inorganic film is disposed as a dielectric film of the capacitor between the first electrode 314 and the second electrode 316. For example, the second interlayer insulating layer 15-2 is not disposed between the first electrode 314 and the second electrode 316. An aperture C5 is formed in the second interlayer insulating layer 15-2 that is an organic layer corresponding to the first electrode 314 of the capacitor. The second electrode 316 is formed inside the aperture C5. A lower surface of the second electrode 316 contacts an upper surface of the first interlayer insulating layer 15-1. Therefore, a thickness of the dielectric film is reduced, thereby increasing a capacitance of the capacitor of the present embodiment.

The first electrode 314 may be formed of the same material as that of the gate electrode 214. The second electrode 316 may be formed of the same material as that of the source electrode 216a and the drain electrode 216b.

The protection layer 418 is formed on the second electrode 316. While etching the pixel electrode 120 by using the protection layer 418 as a mask, the protection layer 418 prevents the second electrode 316 of the capacitor from being exposed to the etchant and, thus, prevents or reduces the particle defect.

The protection layer 418 and the second electrode 316 are etched by using a same (e.g., a single) mask, and thus, etching surfaces of end portions of the protection layer 418 and the second electrode 316 may be identical.

In the pad area PAD1, the pad electrode 416 that is a connection terminal for an external driver is disposed on (e.g., along) a perimeter of the display area DA.

The pad electrode 416 is positioned on the second interlayer insulating layer 15-2, and end portions of the pad electrode 416 are covered by the first organic layer 20.

The pad electrode 416 is formed of the same material as that of the source electrode 216a and the drain electrode 216b. The protection layer 418 is formed on the pad electrode 416. When etching the pixel electrode 120 by using the protection layer 418 as a mask, the protection layer 418 prevents the pad electrode 416 from being exposed to the etchant and, thus, prevents or reduces the particle defect. In addition, the protection layer 418 prevents the pad electrode 416 from being exposed to moisture and oxygen and, thus, prevents or reduces deterioration of the reliability of the pad PAD.

The protection layer 418 and the pad electrode 416 are etched by using a same (e.g., a single) mask, and thus, etching surfaces of end portions of the protection layer 418 and the pad electrode 416 may be identical.

The opposite electrode 122 is not independently formed for each pixel, but is formed as a common electrode that covers the whole display area DA (see FIG. 1). The cathode contact portion CECNT is formed on (e.g., along) the perimeter of the display area DA to supply a signal to the common electrode.

Although the cathode contact portion CECNT is positioned between the display area DA and the pad PAD in FIG. 1, the present invention is not limited thereto. The cathode contact portion CECN may be positioned at any place between the display area DA and the sealing line SL.

Figure 4:
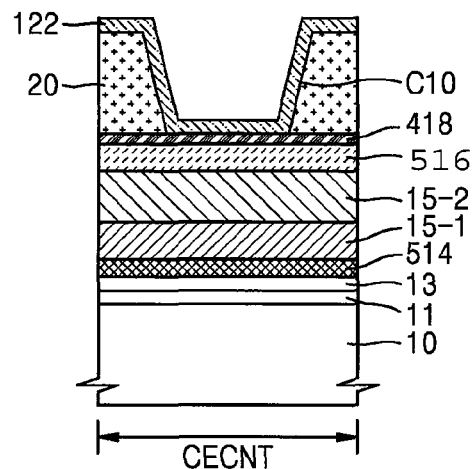
FIG. 4 is a schematic cross-sectional view of a part of a cathode contact portion of the organic light-emitting display apparatus according to an embodiment of the present invention.

FIG. 4 is a schematic cross-sectional view of a part of the cathode contact portion CECNT of the organic light-emitting display apparatus 1 according to an embodiment of the present invention.

A wiring 514 is formed on the substrate 10, on the buffer layer 11, and on the gate insulating layer 13. The wiring 514 may be a signal wiring coupled to (e.g., connected to) a scan line.

The first interlayer insulating layer 15-1 and the second interlayer insulating layer 15-2 are formed on the wiring 514. A cathode contact layer 516 is formed on the second interlayer insulating layer 15-2.

The cathode contact layer 516 may be formed of the same material as that of the source electrode 216a and the drain electrode 216b.

The protection layer 418 is formed on the cathode contact layer 516. The protection layer 418 prevents the cathode contact layer 516 from being exposed to an etchant when etching the pixel electrode 120 and, thus, prevents or reduces a particle defect.

The opposite electrode 122 is electrically coupled to the cathode contact layer 516 via a contact hole C10 formed in the first organic layer 20. With respect to the organic light-emitting display apparatus 1 having a relatively large screen, it may be beneficial to increase an area of the cathode contact portion CECNT to reduce heat generated by supplying power to an electrode. When the area of the cathode contact portion CECNT is increased, there is an area in which the cathode contact portion CECNT overlaps the wiring 514 formed on a lower portion of the cathode contact layer 516. When a thickness of the wiring 514 is relatively large, a short-circuit may occur between the wiring 514 and the cathode contact layer 516 in the overlapped area. However, the second interlayer insulating layer 15-2 that is the organic layer as well as the first interlayer insulating layer 15-1 that is the inorganic layer are disposed between the wiring 514 and the cathode contact layer 516 in the present embodiment, and thus, a short-circuit between the wiring 514 and the cathode contact layer 516 may be prevented or reduced.

The organic light-emitting display apparatus 1 according to the present embodiment may further include an encapsulation member that encapsulates the display area including the pixel area PXL1, the capacitor area CAP1, and thin film transistor area TR1. The encapsulation member may be formed as a substrate including a glass material, a metal film, an encapsulation film formed by alternately disposing an organic insulating film and an inorganic insulating film, or the like.

Hereinafter, a method of manufacturing the organic light-emitting display apparatus 1 according to an embodiment will be explained with reference to FIGS. 3A to 3G.

Figure 3A:
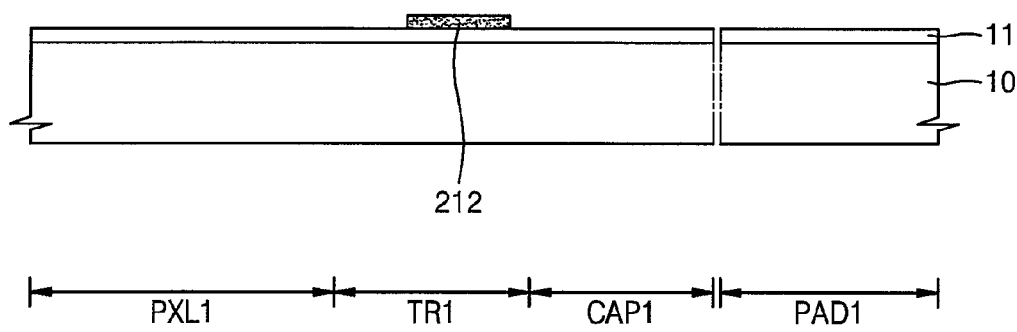
FIGS. 3A to 3G are schematic cross-sectional views illustrating a method of manufacturing the organic light-emitting display apparatus according to an embodiment of the present invention.

FIG. 3A is a schematic cross-sectional view for explaining a first process of manufacturing the organic light-emitting display apparatus 1 according to an embodiment of the present invention.

Referring to FIG. 3A, the buffer layer 11 is formed on the substrate 10, a semiconductor layer is formed on the buffer layer 11, and then, the semiconductor layer is patterned to form the active layer 212 of the thin film transistor.

A photoresistor is coated on the semiconductor layer, and then the semiconductor layer is patterned by photolithography using a first photo mask to form the active layer 212. A first process using photolithography includes exposing the first photo mask by exposure equipment, developing, etching, stripping, or asking and so on.

The semiconductor layer may include amorphous silicon or polysilicon. In one embodiment, the polysilicon may be formed by crystallizing amorphous silicon. Amorphous silicon may be crystallized by using various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. In some embodiments, the semiconductor layer is not limited to include amorphous silicon or polysilicon but also includes oxide semiconductor.

Figure 3B:
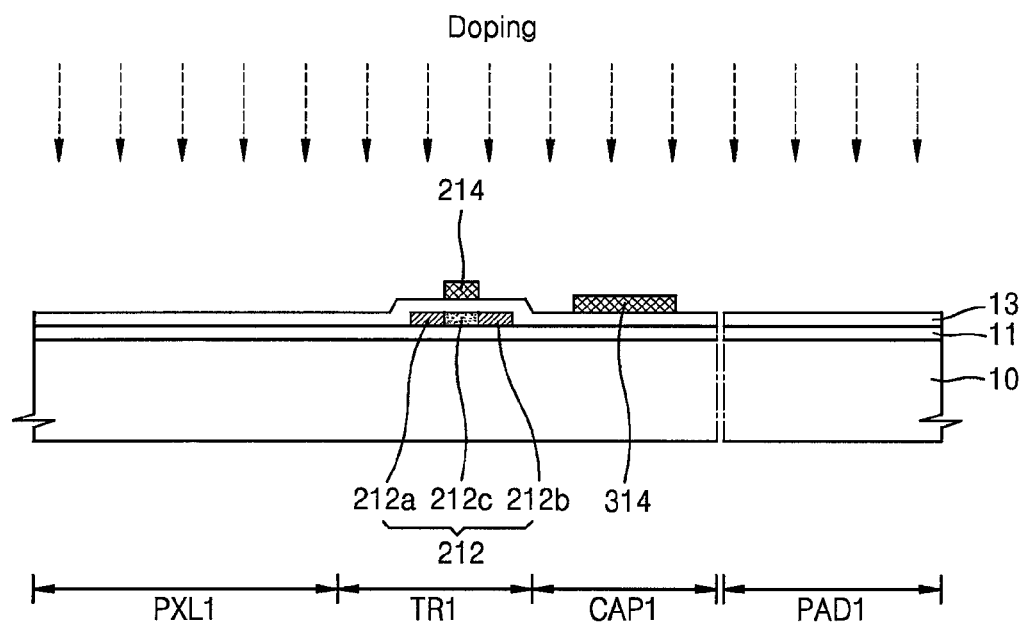

FIG. 3B is a schematic cross-sectional view showing a second process of manufacturing the organic light-emitting display apparatus 1 according to an embodiment of the present invention.

After the first process is completed as shown in FIG. 3A, the gate insulating layer 13 is formed, and a first metal layer is formed on the gate insulating layer 13 and then patterned. The first metal layer may be formed in a single-layer or as a multi-layer structure formed of at least one metal, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

When the patterning process is completed, the gate electrode 214 and the first electrode 314 of the capacitor are formed on the gate insulating layer 13.

Then, an ion impurity is doped thereon. The ion impurity may be an B (boron) or P (phosphorus) ion, and the active layer 212 of the thin film transistor is doped with the ion impurity in a concentration of about $1 \times 10^{15}$ atoms/cm$^2$ or more Because the active layer 212 is doped by the ion impurity by using the gate electrode 214 as a self-aligning mask, the active layer 212 includes the source region 212a and the drain region 212b on which the ion impurity is doped, and a channel region 212c therebetween.

Figure 3C:
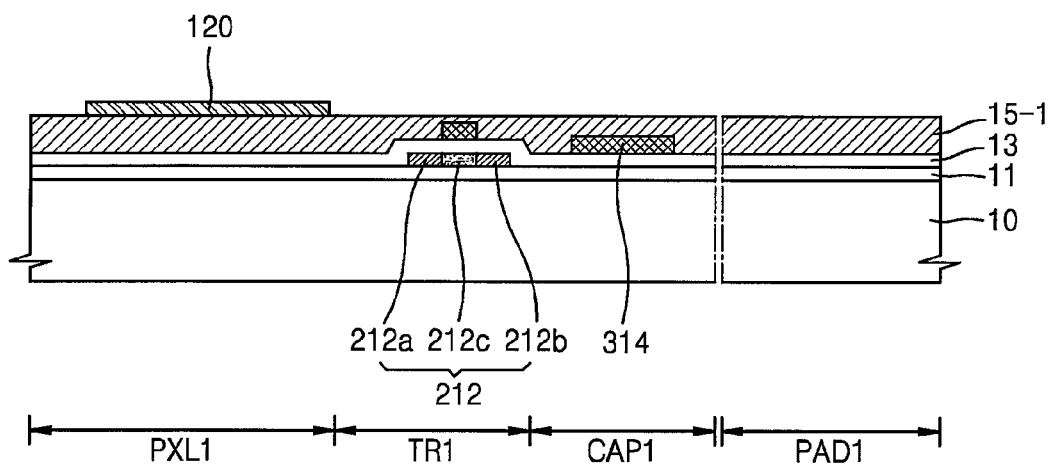

FIG. 3C is a schematic cross-sectional view showing a third process of manufacturing the organic light-emitting display apparatus 1 according to an embodiment of the present invention.

After the second process is completed as shown in FIG. 3B, the first interlayer insulating layer 15-1 is formed, and then a semi-transmissive metal layer is formed on the first interlayer insulating layer 15-1. Then, the semi-transmissive metal layer is patterned to form the pixel electrode 120.

The first interlayer insulating layer 15-1 may be formed in a single-layer or as a multi-layer structure formed of silicon nitride and/or silicon oxide.

Figure 3D:
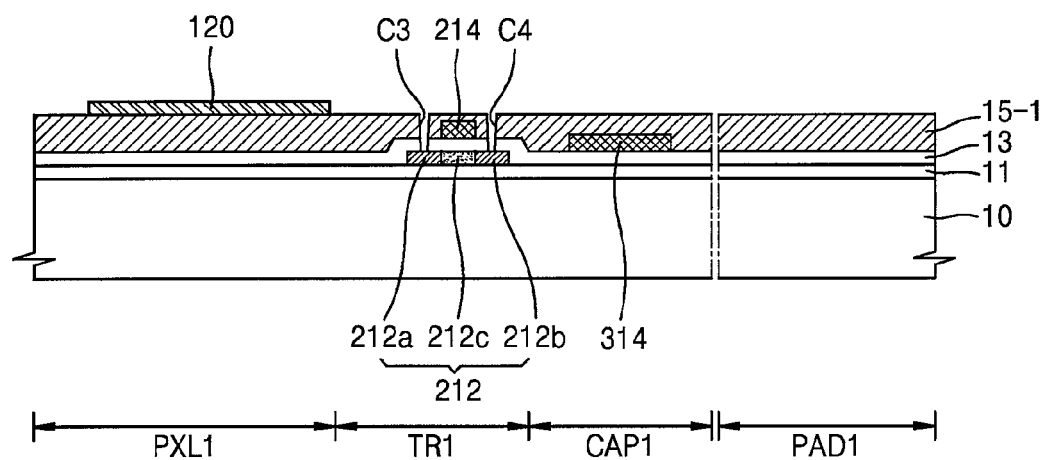

FIG. 3D is a schematic cross-sectional view showing a fourth process of manufacturing the organic light-emitting display apparatus 1 according to an embodiment of the present invention.

The first interlayer insulating layer 15-1 formed in the third process is patterned to form apertures C3 and C4 respectively exposing the source region 212a and the drain region 212b of the active layer 212.

Figure 3E:
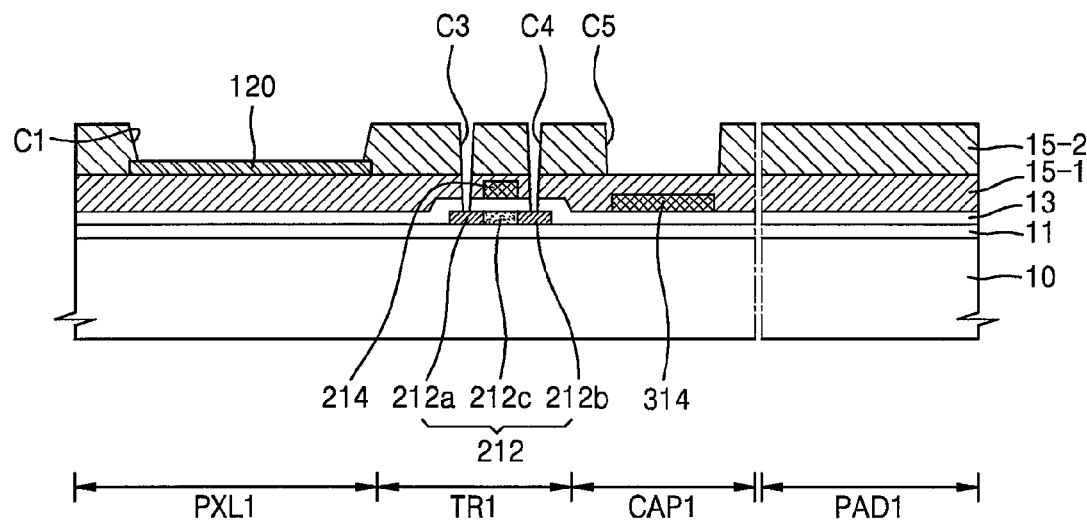

FIG. 3E is a schematic cross-sectional view showing a fifth process of manufacturing the organic light-emitting display apparatus 1 according to an embodiment of the present invention.

Referring to FIG. 3E, after the fourth process is completed as shown in FIG. 3D, the second interlayer insulating layer 15-2 is formed and the apertures C3 and C4 formed in the fourth process are patterned to extend (e.g., to extend through the second interlayer insulating layer 15-2). At the same time (e.g., concurrently or during the same process), the second interlayer insulating layer 15-2 is patterned so that the aperture C1 exposing an upper surface of the pixel electrode 120 and the aperture C5 exposing some portions of the second interlayer insulating layer 15-2 corresponding to the first electrode 314 of the capacitor are formed.

The second interlayer insulating layer 15-2 may be formed of an organic insulating film including, for example, a commercial polymer (PMMA and/or PS), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, and/or blends thereof.

Figure 3F:
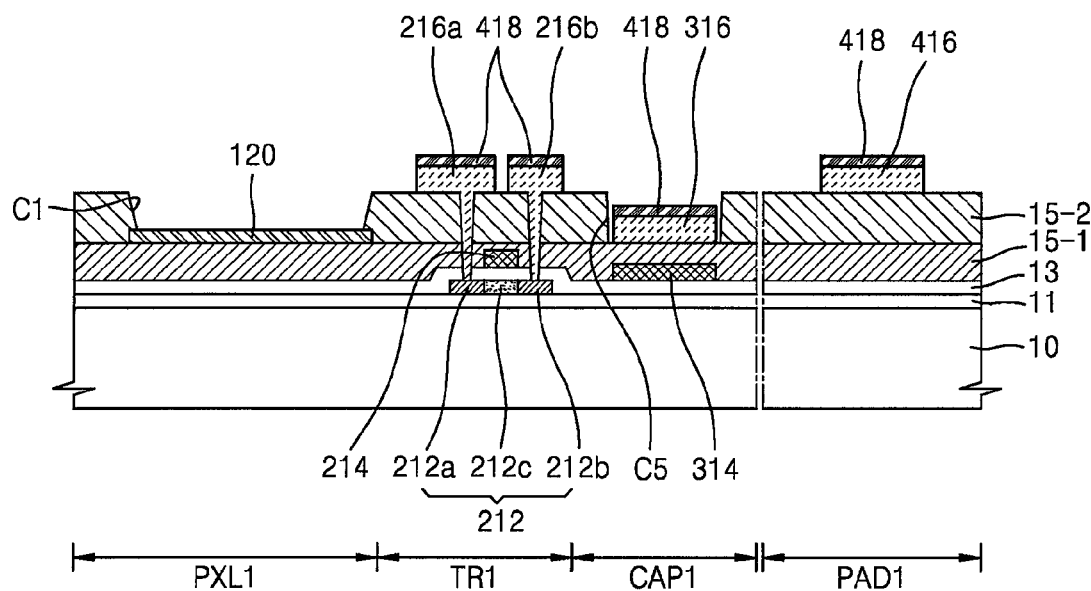

FIG. 3F is a schematic cross-sectional view showing a sixth process of manufacturing the organic light-emitting display apparatus 1 according to an embodiment of the present invention.

Referring to 3F, after the fifth process is completed as shown in FIG. 3E, a second metal layer and a transparent conductive oxide layer are sequentially deposited and patterned to concurrently form the source electrode 216a, the drain electrode 216b, the second electrode of the capacitor, and the pad electrode 416.

The second metal layer may include two or more different metal layers having different electron mobilities. For example, the second metal layer may include two or more metal layers including, for example, aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or an alloy thereof.

In this embodiment, the protection layer 418 formed by patterning the transparent conductive oxide layer is formed on the source electrode 216a, the drain electrode 216b, the second electrode 316 of the capacitor, and the pad electrode 416. Because the second metal layer and the transparent conductive oxide layer are concurrently patterned, each end portion of the source electrode 216a, the drain electrode 216b, the second electrode 316 of the capacitor, and the pad electrode 416, and an end portion of the protection layer 418 formed thereon have the same etching surface.

Figure 3G:
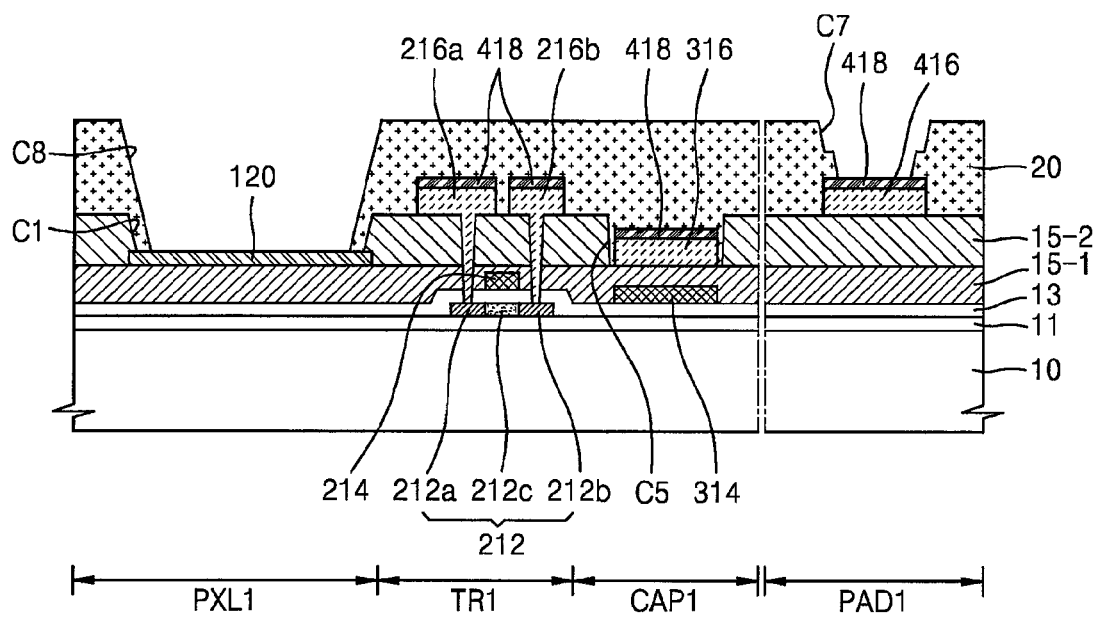

FIG. 3G is a schematic cross-sectional view showing a seventh process of manufacturing the organic light-emitting display apparatus 1 according to an embodiment of the present invention.

Referring to FIG. 3G, after the sixth process is completed as shown in FIG. 3F, the first organic layer 20 is formed, and then the seventh process in which the aperture C8 exposing an upper surface of the pixel electrode 120 is formed is performed.

The first organic layer 20 acts as a pixel defining layer and may be, for example, formed of an organic insulating film including a commercial polymer (PMMA and/or PS), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, and/or blends thereof.

According to embodiments of the organic light-emitting display apparatus 1 provided herein and the method of manufacturing the same, the pixel electrode 120 includes the semi-transmissive metal layer 120b so that the micro-cavity structure may improve luminescent efficiency of the organic light-emitting display apparatus 1.

Also, by covering the source electrode 216a or the drain electrode 216b with the first organic layer 20, the source electrode 216a or the drain electrode 216b is not exposed to an etchant including a silver (Ag) ion so that a particle-type defect caused by a renucleation of silver (Ag) may be prevented or reduced.

In addition, the first interlayer insulating layer 15-1 that is the inorganic layer and the second interlayer insulating layer 15-2 that is the organic layer are included between the gate electrode 214 and the source and the drain electrodes 216a and 216b so that a crack in the first interlayer insulating layer 15-1 may be prevented or reduced even when a thickness of the gate electrode 214 and the wiring is relatively large and a parasitic capacitance between the wirings on the upper and lower portions of the first and second interlayer insulating layers 15-1 and 15-2 may be reduced to accurately transmit a signal.

Moreover, only the first interlayer insulating layer 15-1 that is the inorganic film is disposed between the first electrode 314 and the second electrode 316 as the dielectric film of the capacitor so that the thickness of the dielectric film may be reduced and a dielectric permittivity thereof may be increased, thereby increasing a capacity of the capacitor.

Figure 5A:
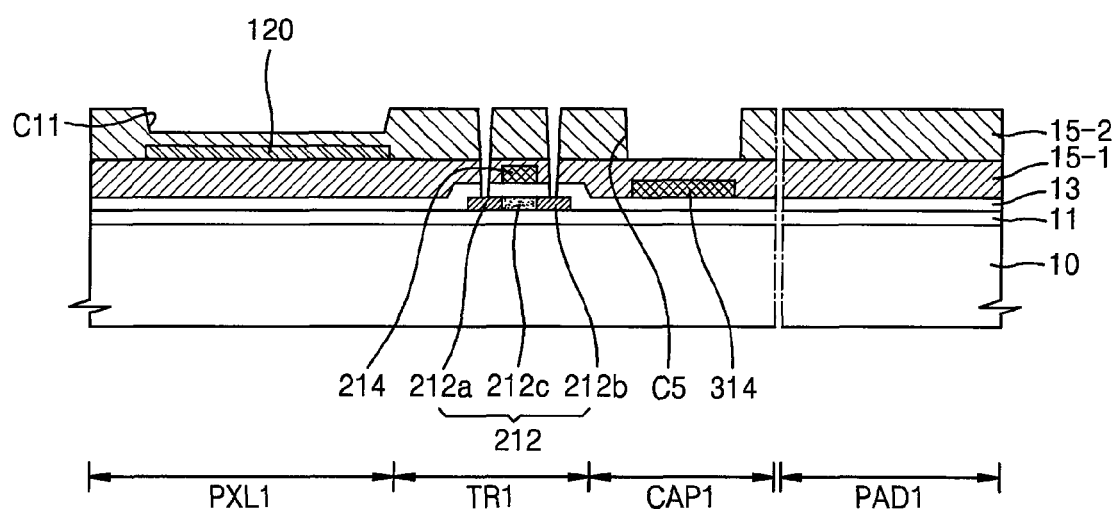
FIGS. 5A to 5C are schematic cross-sectional views illustrating a method of manufacturing the organic light-emitting display apparatus according to another embodiment of the present invention.
Figure 5B:
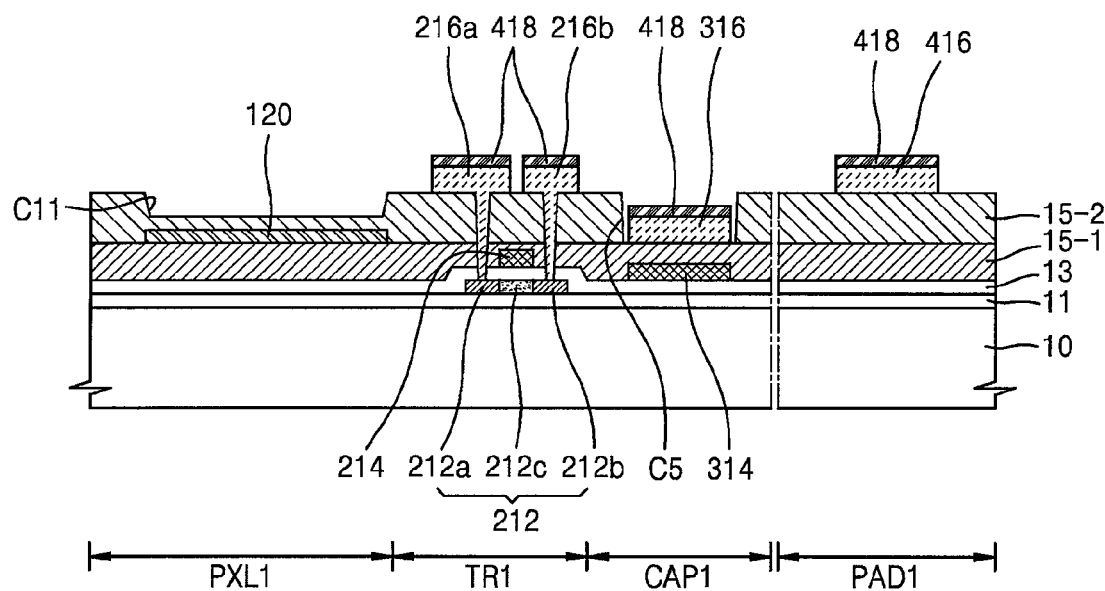
Figure 5C:
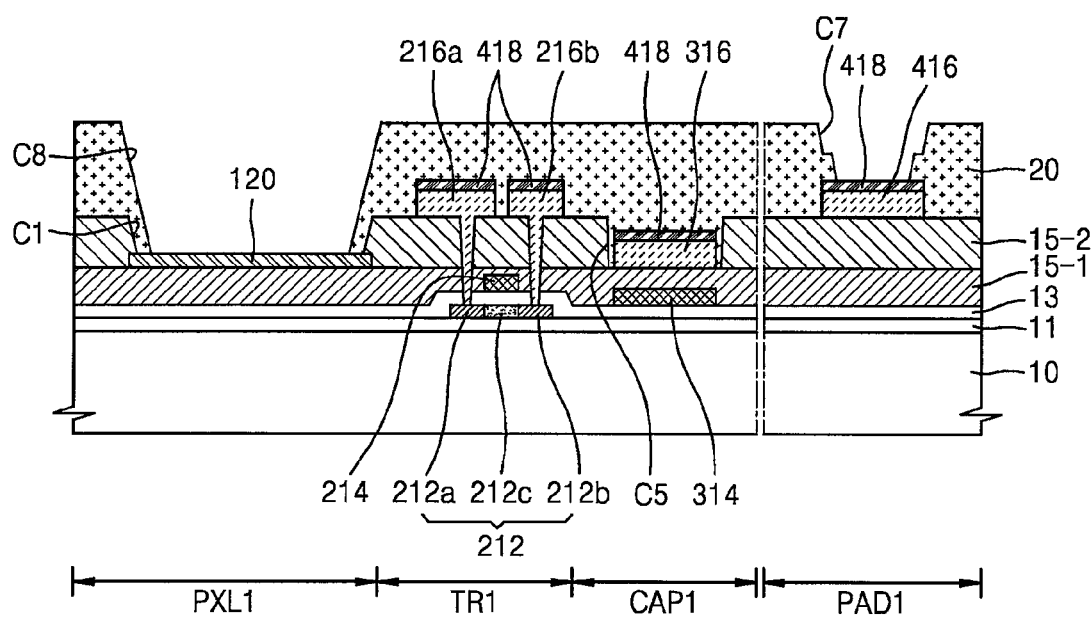

FIGS. 5A to 5C show a method of manufacturing an organic light-emitting display apparatus 1 according to another embodiment of the present invention.

FIG. 5A shows another embodiment of the fifth process, FIG. 5B shows another embodiment of the sixth process, and FIG. 5C shows another embodiment of the seventh process.

Referring to FIG. 5A, after the fourth process is completed as shown in FIG. 3D, the second interlayer insulating layer 15-2 is formed and patterned to extend the apertures C3 and C4 formed in the fourth process. Also, the second interlayer insulating layer 15-2 is patterned to form the aperture C5 exposing some portions of the second interlayer insulating layer corresponding to the first electrode 314 of the capacitor.

According to another embodiment of the fifth process, when the aperture C1 exposing the upper surface of the pixel electrode 120 is formed, the second interlayer insulating layer 15-2 is patterned to have a certain thickness of the second interlayer insulating layer 15-2 on the upper surface of the pixel electrode 120, and thus, in this embodiment, the upper surface of the pixel electrode 120 is not exposed.

Referring to FIG. 5B, after the fifth process is completed as shown in FIG. 5A, the second metal layer and the transparent conductive oxide layer are sequentially deposited and patterned in the same or substantially the same manner as in the sixth process in FIG. 3F, and then the protection layer 418 as well as the source electrode 216a, the drain electrode 216b, the second electrode 316 of the capacitor, and the pad electrode 416 are concurrently formed.

Referring to FIG. 5C, after the sixth process is completed as shown in FIG. 5B, the first organic layer 20 is formed and then the seventh process in which the aperture C8 exposing the upper surface of the pixel electrode 120 is formed is performed. In this embodiment, the certain thickness of the second interlayer insulating layer 15-2 left on (e.g., remaining on) the upper surface of the pixel electrode 120 in the fifth process illustrated in FIG. 5A is removed along with the first organic layer 20.

According to the manufacturing method provided herein, when the source electrode 216a and the drain electrode 216b are etched, the pixel electrode 120 is not exposed and the second interlayer insulating layer 15-2 protects the pixel electrode 120. In this regard, the upper surface of the pixel electrode 120 may not be deteriorated, thereby improving a display quality of a display apparatus.

Figure 6:
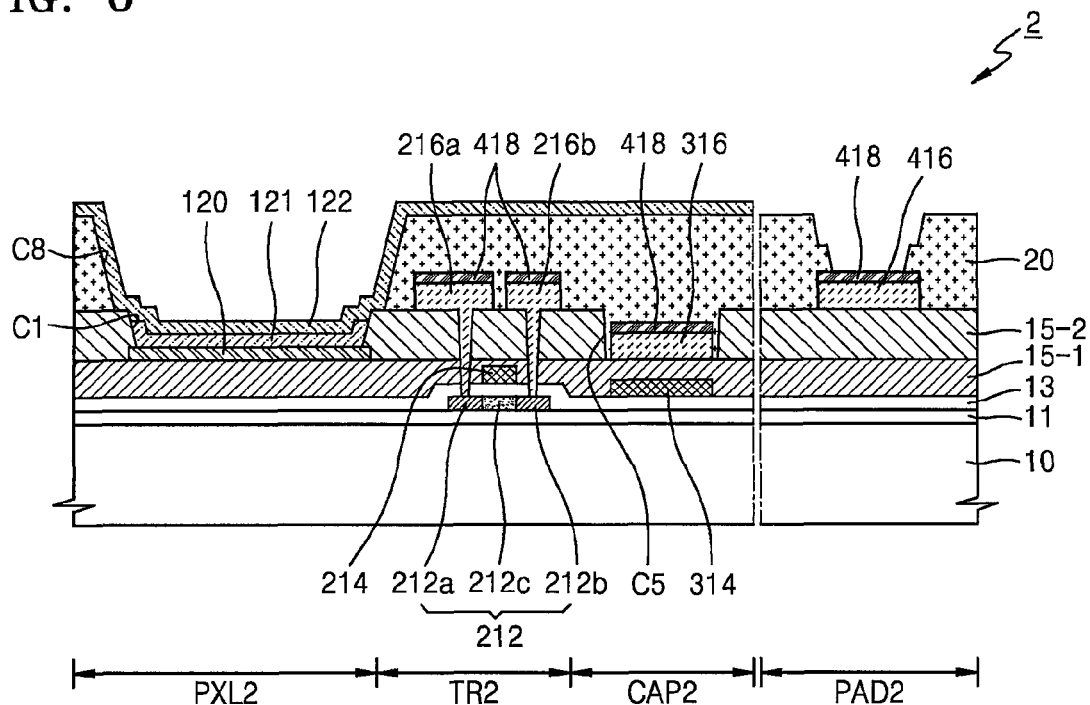
FIG. 6 is a schematic cross-sectional view showing some portions of a light-emitting pixel and a pad of an organic light-emitting display apparatus according to another embodiment of the present invention.

FIG. 6 is a schematic cross-sectional view showing some portions of a light-emitting pixel and a pad of an organic light-emitting display apparatus 2 according to another embodiment of the present invention.

Referring to FIG. 6, the organic light-emitting display apparatus 2 includes a pixel area PXL2 including at least one organic emission layer 121 on the substrate 10; a transistor area TR2 including at least one thin film transistor; a capacitor area CAP2 including at least one capacitor; and a pad area PAD2.

Hereinafter, a difference between the organic light-emitting display apparatus 1 according to an embodiment of the present invention and the organic light-emitting display apparatus 2 according to another embodiment of the present invention will be mainly described.

Structures of the transistor area TR2, the capacitor area CAP2, and the pad area PAD2 are the same or substantially the same as the corresponding structures of the previously-described embodiment but a structure of the pixel area PXL2 is different from the corresponding structure of the previously-described embodiment.

The pixel area PXL2 includes the buffer layer 11, the gate insulating layer 13, and the pixel electrode 120 on the first interlayer insulating layer 15-1. The pixel electrode 120 is disposed in an aperture formed in a region where the aforementioned thin film transistor and the capacitor do not overlap with each other.

A width of the aperture C8 formed in the first organic layer 20 is larger than that of the aperture C1 formed in the second interlayer insulating layer 15-2. The aperture C8 formed in the first organic layer 20 and the aperture C1 formed in the second interlayer insulating layer 15-2 are positioned to overlap with each other.

According to an embodiment described above, an end portion of the first organic layer 20 is in the aperture C1 formed in the second interlayer insulating layer 15-2. However, according to another embodiment, the end portion of the first organic layer 20 is outside the aperture C1 (e.g., is not in the aperture C1) formed in the second interlayer insulating layer 15-2. Therefore, the end portion of the first organic layer 20 does not contact the pixel electrode 120.

The first organic layer 20 including an organic insulating material has a high absorption coefficient, and thus, outgassing that affects a lifetime of an organic light-emitting device may occur in a manufacturing process.

Figure 7:
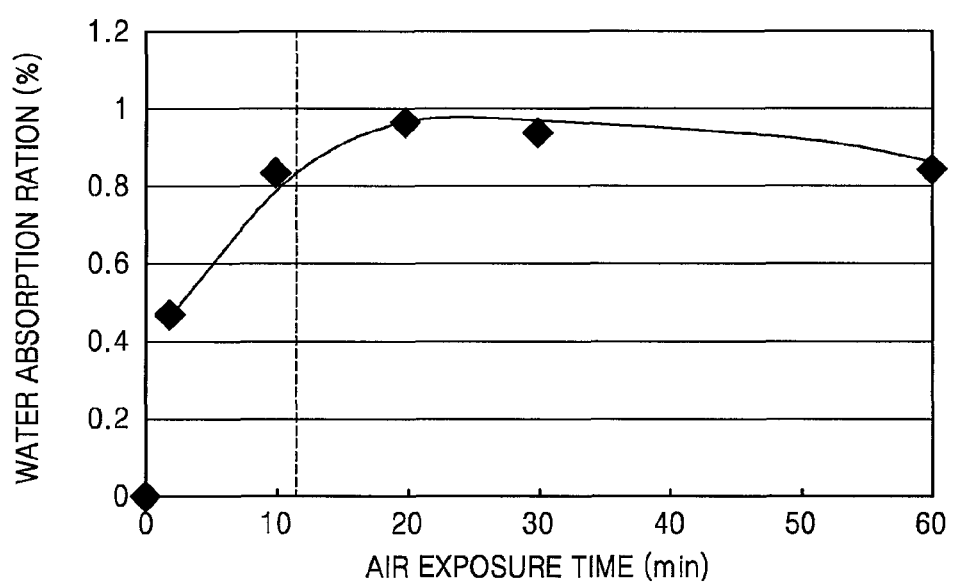
FIG. 7 is a graph showing a relationship between air exposure time and water absorption ratio of a first organic layer according to an embodiment of the present invention.

FIG. 7 is a graph showing a relationship between air exposure time and a water absorption ratio of the first organic layer 20. The X-axis denotes the air exposure time of the first organic layer 20, and the y-axis denotes the water absorption ratio of the first organic layer 20. In this embodiment, polyimide is used for the first organic layer 20.

Referring to FIG. 7, it is found that after about 10 minutes has passed after the first organic layer 20 including polyimide is exposed to air, about 1% of the water absorption ratio is maintained. When the water absorption ratio of the first organic layer 20 is relatively large, the first organic layer 20 may be highly affected by outgassing.

However, according to an embodiment of the present invention, the first organic layer 20 is only formed outside the aperture C1 formed in the second interlayer insulating layer 15-2, and thus, the area of the first organic layer 20 contacting the organic emission layer 121 is decreased. In this regard, the outgassing effect may be reduced.

As described above, according to the one or more of the above exemplary embodiments, display quality and yield of an organic light-emitting display apparatus are improved.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. An organic light-emitting display apparatus comprising:
   a substrate;
   a thin film transistor on the substrate and comprising an active layer, a gate electrode, a source electrode, and a drain electrode;
   a first interlayer insulating layer between the gate electrode and the source electrode and between the gate electrode and the drain electrode, the first interlayer insulating layer comprising an inorganic material;
   a second interlayer insulating layer between the first interlayer insulating layer and the source electrode and between the first interlayer insulating layer and the drain electrode, the second interlayer insulating layer comprising an organic material;
   a first organic layer on the source electrode and the drain electrode;
   a capacitor comprising a first electrode comprising the same material as that of the gate electrode, a second electrode comprising the same material as that of the source electrode and the drain electrode, and the first interlayer insulating layer between the first electrode and the second electrode;
   a pixel electrode in an aperture in the second interlayer insulating layer at an area adjacent to the thin film transistor and the capacitor, the pixel electrode being coupled to one of the source electrode and the drain electrode;
   an organic emission layer on the pixel electrode;
   an opposite electrode on the organic emission layer; and
   a pad electrode on the same layer as the source electrode and the drain electrode.

2. The organic light-emitting display apparatus of claim 1, wherein the pixel electrode is a semi-transmissive electrode, and the opposite electrode is a reflective electrode.

3. The organic light-emitting display apparatus of claim 2, wherein the pixel electrode comprises a first transparent conductive oxide layer, a semi-transmissive metal layer, and a second transparent conductive oxide layer.

4. The organic light-emitting display apparatus of claim 1, wherein an end portion of the pixel electrode is on the first interlayer insulating layer and is covered by the second interlayer insulating layer.

5. The organic light-emitting display apparatus of claim 1, wherein the aperture in which the pixel electrode is disposed exposes the second interlayer insulating layer and the first organic layer.

6. The organic light-emitting display apparatus of claim 5, wherein a diameter of the aperture in the second interlayer insulating layer is greater than a diameter of an aperture in the first organic layer.

7. The organic light-emitting display apparatus of claim 1, wherein a lower surface of the pixel electrode contacts an upper surface of the first interlayer insulating layer.

8. The organic light-emitting display apparatus of claim 1, wherein a thickness of the gate electrode is in a range of about 6,000 Å to about 12,000 Å.

9. The organic light-emitting display apparatus of claim 1, wherein the second electrode of the capacitor is in another aperture in the second interlayer insulating layer.

10. The organic light-emitting display apparatus of claim 9, wherein a lower surface of the second electrode of the capacitor contacts an upper surface of the first interlayer insulating layer.

11. The organic light-emitting display apparatus of claim 1, wherein a protection layer is on the source electrode and on the drain electrode.

12. The organic light-emitting display apparatus of claim 1, wherein a protection layer is on the pad electrode.

13. The organic light-emitting display apparatus of claim 1, further comprising: a cathode contact layer on the second interlayer insulating layer and contacting the opposite electrode via a contact opening in the first organic layer.

14. The organic light-emitting display apparatus of claim 13, wherein the cathode contact layer comprises the same material as that of the source electrode and the drain electrode.

15. The organic light-emitting display apparatus of claim 14, wherein a protection layer is on the cathode contact layer.

16. The organic light-emitting display apparatus of claim 1, wherein the pixel electrode comprises a first transparent conductive oxide layer, a semi-transmissive metal layer, and a second transparent conductive oxide layer.

17. An organic light-emitting display apparatus, comprising:
    a substrate;
    a thin film transistor on the substrate and comprising an active layer, a gate electrode, a source electrode, and a drain electrode;
    a first interlayer insulating layer between the gate electrode and the source electrode and between the gate electrode and the drain electrode, the first interlayer insulating layer comprising an inorganic material;
    a second interlayer insulating layer between the first interlayer insulating layer and the source electrode and between the first interlayer insulating layer and the drain electrode, the second interlayer insulating layer comprising an organic material;
    a first organic layer on the source electrode and the drain electrode;
    a capacitor comprising a first electrode comprising the same material as that of the gate electrode, a second electrode comprising the same material as that of the source electrode and the drain electrode, and the first interlayer insulating layer between the first electrode and the second electrode;
    a pixel electrode in an aperture in the second interlayer insulating layer at an area adjacent to the thin film transistor and the capacitor, the pixel electrode being coupled to one of the source electrode and the drain electrode, a diameter of the aperture in the second interlayer insulating layer being smaller than a diameter of an aperture in the first organic layer;
    an organic emission layer on the pixel electrode; and
    an opposite electrode on the organic emission layer.

18. The organic light-emitting display apparatus of claim 17, wherein an end portion of the first organic layer is outside the aperture in the second interlayer insulating layer.

19. A method of manufacturing an organic light-emitting display apparatus, the method comprising:
    a first process comprising forming a semiconductor layer on a substrate, patterning the semiconductor layer, and then forming an active layer of a thin film transistor;
    a second process comprising forming a first insulating layer, forming a first metal layer on the first insulating layer, and patterning the first metal layer to form a gate electrode of the thin film transistor and a first electrode of a capacitor;

a third process comprising forming a first interlayer insulating layer, forming a semi-transmissive metal layer on the first interlayer insulating layer, and patterning the semi-transmissive metal layer to form a pixel electrode;

a fourth process comprising forming the first interlayer insulating layer and forming an aperture in the first interlayer insulating layer to expose a portion of the active layer;

a fifth process comprising forming a second interlayer insulating layer and patterning the second interlayer insulating layer to form apertures respectively exposing the portion of the active layer, an upper portion of the pixel electrode, and the first interlayer insulating layer corresponding to the first electrode of the capacitor;

a sixth process comprising forming a second metal layer and a protection layer, and patterning the second metal layer and the protection layer to form a source electrode, a drain electrode, a second electrode of the capacitor, and a pad electrode; and a seventh process comprising forming a first organic layer and patterning the first organic layer to form apertures respectively exposing an upper portion of the pixel electrode and an upper portion of the pad electrode.

20. The method of claim 19, wherein the first interlayer insulating layer comprises an inorganic film, and the second interlayer insulating layer comprises an organic film.

21. The method of claim 19, wherein in the fifth process, the second interlayer insulating layer is patterned such that a portion of the second interlayer insulating layer remains on an upper surface of the pixel electrode, and in the seventh process, the first organic layer and the remaining portion of the second interlayer insulating layer is patterned to expose the upper surface of the pixel electrode.

22. The method of claim 19, wherein in the seventh process, an end portion of the first organic layer is outside the aperture in the second interlayer insulating layer that exposes the upper portion of the pixel electrode.

* * * * *